(12) United States Patent
Lee

(10) Patent No.: US 10,319,951 B2
(45) Date of Patent: Jun. 11, 2019

(54) ORGANIC LIGHT-EMITTING DISPLAY DEVICE AND METHOD FOR MANUFACTURING THE SAME

(71) Applicant: LG Display Co., Ltd., Seoul (KR)

(72) Inventor: Myeonghwa Lee, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/825,693

(22) Filed: Nov. 29, 2017

(65) Prior Publication Data

US 2018/0151850 A1 May 31, 2018

(30) Foreign Application Priority Data

Nov. 30, 2016 (KR) .......................... 10-2016-0161469

(51) Int. Cl.
| | |
|---|---|
| *H01L 27/32* | (2006.01) |
| *H01L 51/56* | (2006.01) |
| *H01L 51/00* | (2006.01) |
| *H01L 51/50* | (2006.01) |
| *H01L 51/52* | (2006.01) |

(52) U.S. Cl.
CPC .......... *H01L 51/56* (2013.01); *H01L 27/3206* (2013.01); *H01L 27/3211* (2013.01); *H01L 27/3223* (2013.01); *H01L 27/3246* (2013.01); *H01L 27/3248* (2013.01); *H01L 51/0002* (2013.01); *H01L 51/0011* (2013.01); *H01L 51/5056* (2013.01); *H01L 51/5203* (2013.01); *H01L 2227/323* (2013.01)

(58) Field of Classification Search
CPC ............. H01L 27/3206; H01L 27/3246; H01L 27/3211; H01L 27/3223
See application file for complete search history.

(56) References Cited

U.S. PATENT DOCUMENTS

2005/0236620 A1 10/2005 Yamada

FOREIGN PATENT DOCUMENTS

| KR | 10-2006-0061662 A | 6/2006 |
| KR | 10-0728145 B1 | 6/2007 |
| KR | 10-1630328 B1 | 6/2016 |

*Primary Examiner* — Douglas M Menz

(74) *Attorney, Agent, or Firm* — Morgan, Lewis & Bockius LLP

(57) ABSTRACT

Provided are an organic light-emitting display (OLED) device and a method of manufacturing the same. An OLED device includes: a substrate, a display area on the substrate, the display area including: a first pixel including a first organic light-emitting layer configured to emit first-colored light, a second pixel including a second organic light-emitting layer configured to emit second-colored light, and a third pixel including a third organic light-emitting layer configured to emit third-colored light, and an inspection pattern area in a non-display area on the substrate, the inspection pattern area including a first inspection pixel including a first inspection organic light-emitting layer including a same material as that of the first organic light-emitting layer.

10 Claims, 15 Drawing Sheets

ORGANIC LIGHT-EMITTING DISPLAY DEVICE AND METHOD FOR MANUFACTURING THE SAME

CROSS-REFERENCE TO RELATED APPLICATIONS

This application claims the priority of Korean Application No. 10-2016-0161469, filed on Nov. 30, 2016, the entirety of which is hereby incorporated by reference.

BACKGROUND

1. Technical Field

The present disclosure relates to an organic light-emitting display (OLED) device and a method for manufacturing the same.

2. Discussion of the Related Art

With the advancement of an information-oriented society, various requirements for a display device for displaying an image are increasing. Thus, various display devices, including a liquid crystal display (LCD) device, a plasma display panel (PDP) device, and an organic light-emitting display (OLED) device, have been utilized.

The OLED device is a self light-emitting display device. In comparison to the LCD device, the OLED device has wider viewing angle and greater contrast ratio. Also, the OLED device may be fabricated to be lightweight and slim, as it does not need a separate light source, unlike the LCD device. Furthermore, the OLED device is advantageous in view of power consumption. In addition, the OLED device may be driven by a low DC voltage, and a response speed of the OLED device is rapid. In addition, the OLED device may have the advantage of low manufacturing cost.

The OLED device may include pixels respectively provided with organic light-emitting devices, and a bank for dividing the pixels to define the pixels. The bank functions as a pixel defining film. The organic light-emitting device may include an anode electrode, a hole transporting layer, an organic light-emitting layer, an electron transporting layer, and a cathode electrode. In this case, when a high potential voltage is applied to the anode electrode, and a low potential voltage is applied to the cathode electrode, holes and electrons are respectively moved to the organic light-emitting layer via the hole transporting layer and the electron transporting layer, and are then combined to each other in the organic light-emitting layer to thereby emit light.

Each pixel may include a red pixel including a red organic light-emitting layer for emitting red light, a green pixel including a green organic light-emitting layer for emitting green light, and a blue pixel including a blue organic light-emitting layer for emitting blue light. In this case, the red organic light-emitting layer is formed in the red pixels by the use of first fine metal mask (FMM) having an opening for the red pixels, the green organic light-emitting layer is formed in the green pixels by the use of second FMM having an opening for the green pixels, and the blue organic light-emitting layer is formed in the green pixels by the use of third FMM having an opening for the blue pixels.

Before carrying out the above FMM process, an alignment inspection is carried out to check whether the red organic light-emitting layer, the green organic light-emitting layer, and the blue organic light-emitting layer are properly aligned in the respective red, green, and blue pixels on an inspection substrate (test substrate). That is, an alignment error for each of the red organic light-emitting layer, the green organic light-emitting layer, and the blue organic light-emitting layer is checked by the use of additional inspection substrate.

SUMMARY

Accordingly, the present disclosure is directed to an organic light-emitting display device and a method for manufacturing the same that substantially obviate one or more of the issues due to limitations and disadvantages of the related art.

An aspect of the present disclosure is to provide an organic light emitting display device which includes organic light emitting layers for an alignment inspection on a substrate provided with thin film transistors so as to reduce a manufacturing cost by omitting an additional inspection substrate, and a method for manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting display (OLED) device, including: a substrate, a display area on the substrate, the display area including: a first pixel including a first organic light-emitting layer configured to emit first-colored light, a second pixel including a second organic light-emitting layer configured to emit second-colored light, and a third pixel including a third organic light-emitting layer configured to emit third-colored light, and an inspection pattern area in a non-display area on the substrate, the inspection pattern area including a first inspection pixel including a first inspection organic light-emitting layer including a same material as that of the first organic light-emitting layer.

In another aspect, there is provided a method for manufacturing an OLED device, the method including: providing a first substrate, the first substrate including: a display area, and a non-display area, providing first electrodes and inspection keys on the first substrate, providing a common hole transporting layer in first to third pixels of the display area using a first open mask including an opening corresponding to the display area, providing first hole transporting layers in the first pixels of the display area and a second inspection pixel of the non-display area using a first mask, providing second hole transporting layers in the second pixels of the display area and a fourth inspection pixel of the non-display area using a second mask, providing first organic light-emitting layers in the first pixels of the display area and a first inspection pixel of the non-display area using a third mask, providing second organic light-emitting layers in the second pixels of the display area and a third inspection pixel of the non-display area using a fourth mask, and providing third organic light-emitting layers in the third pixels of the display area and a fifth inspection pixel of the non-display area using a fifth mask.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that are included to provide a further understanding of the disclosure and are incorporated in and constitute a part of this application, illustrate embodiments of the disclosure and together with the description serve to explain various principles of the disclosure.

Figure 1:
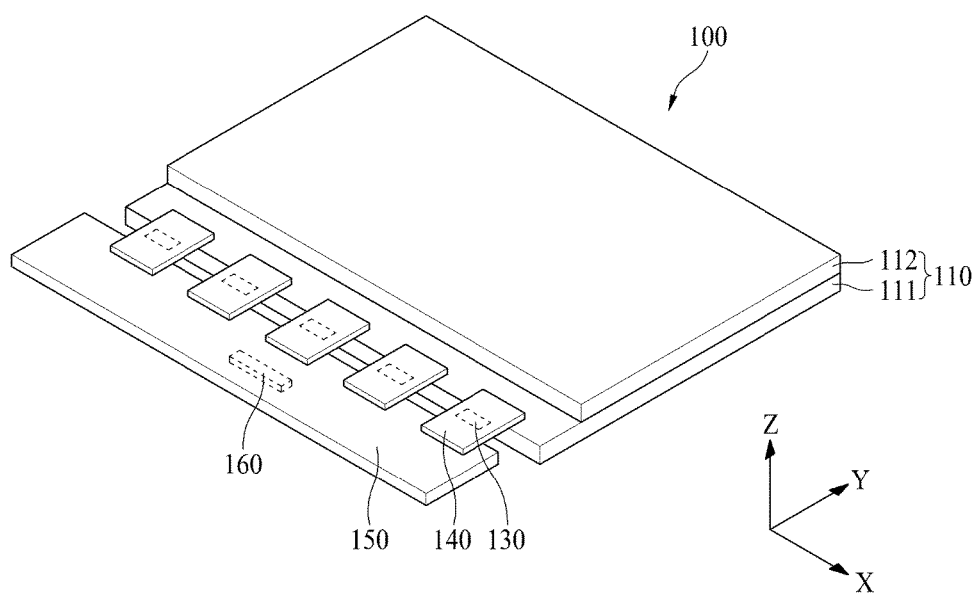
FIG. 1 is a perspective view illustrating an OLED device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Also, "x-axis direction," "y-axis direction," and "z-axis direction" are not limited to a perpendicular geometric configuration. That is, "x-axis direction," "y-axis direction," and "z-axis direction" may include an applicable wide range of a functional configuration.

Hereinafter, an organic light-emitting display (OLED) device according to the embodiment of the present disclosure and a method for manufacturing the same will be described in detail with reference to the accompanying drawings.

Figure 2:
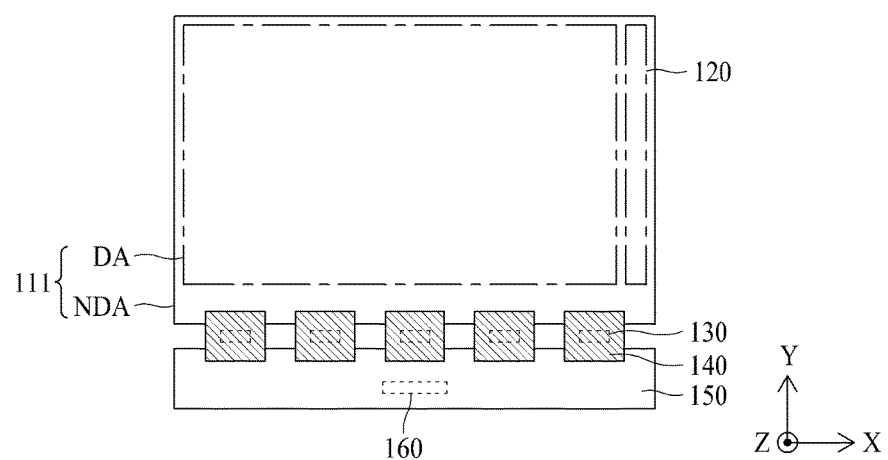
FIG. 2 is a plane view illustrating a first substrate, a gate driver, a source drive integrated circuit (IC), a flexible film, a circuit board, and a timing controller of FIG. 1.

FIG. 1 is a perspective view illustrating an OLED device according to an embodiment of the present disclosure. FIG. 2 is a plane view illustrating a first substrate, a gate driver, a source drive integrated circuit (IC), a flexible film, a circuit board, and a timing controller of FIG. 1.

With reference to FIGS. 1 and 2, the OLED device 100 according to an embodiment of the present disclosure may include a display panel 110, a gate driver 120, a source drive integrated circuit (source drive IC) 130, a flexible film 140, a circuit board 150, and a timing controller 160. The display panel 110 may include a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film (or protection film).

Gate lines, data lines, and pixels may be on one surface of the first substrate 111 confronting or facing the second substrate 112. The pixels may be prepared in respective areas defined by crossing the gate lines and the data lines.

Each of the pixels may include a thin film transistor, and an organic light-emitting device, including a first electrode, an organic light-emitting layer, and a second electrode. If a gate signal is supplied from the gate line to each pixel through the thin film transistor, a predetermined current may be supplied to the organic light-emitting device in accordance with a data voltage of the data line. Accordingly, the organic light-emitting device for each of the pixels may emit light with a predetermined brightness in accordance with the predetermined current. A structure of each of the pixels will be described in detail with reference to the example of FIG. 4.

As shown in the FIG. 2 example, the display panel 110 may include a display area DA provided with the pixels for displaying an image, and a non-display area NDA in which an image is not displayed. The gate lines, the data lines, and the pixels may be provided in the display area DA. The gate driver 120 and pads may be provided in the non-display area NDA.

The gate driver 120 may supply gate signals to the gate lines in accordance with a gate control signal, which may be provided from the timing controller 160. The gate driver 120 may be provided in one side of the display area DA of the display panel 110, or the non-display area NDA of both peripheral sides of the display panel 110 by a gate-driver-in-panel (GIP) method. In other examples, the gate driver 120 may be manufactured in a driving chip, may be mounted on the flexible film, or may be attached to one side of the display area DA of the display panel 110, or the non-display area NDA of both peripheral sides of the display panel 110 by a tape automated bonding (TAB) method.

The source drive IC 130 may receive digital video data and source control signals from the timing controller 160. The source drive IC 130 may convert the digital video data into analog data voltages in accordance with the source control signal, and may supply the analog data voltages to the data lines. If the source drive IC 130 is manufactured in a driving chip, the source drive IC 130 may be mounted on the flexible film 140 by a chip on film (COF) method or a chip-on-plastic (COP) method.

The pads, such as data pads, may be provided in the non-display area NDA of the display panel 110. In the flexible film 140, there may be lines for connecting the pads with the source drive IC 130, and lines for connecting the pads with the lines of the circuit board 150. The flexible film 140 may be attached to the pads by the use of anisotropic conducting film, whereby the pads may be connected with the lines of the flexible film 140.

The circuit board 150 may be attached to the flexible film 140. A plurality of circuits, which may be realized in a plurality of driving chips, may be mounted on the circuit board 150. For example, the timing controller 160 may be mounted on the circuit board 150. The circuit board 150 may be a printed circuit board or a flexible printed circuit board.

The timing controller 160 may receive digital video data and a timing signal from an external system board via a cable of the circuit board 150. The timing controller 160 may generate the gate control signal for controlling an operation timing of the gate driver 120 and the source control signal for controlling the source drive IC 130 based on the timing signal. The timing controller 160 may supply the gate control signal to the gate driver 120, and may supply the source control signal to the source drive IC 130.

Figure 3:
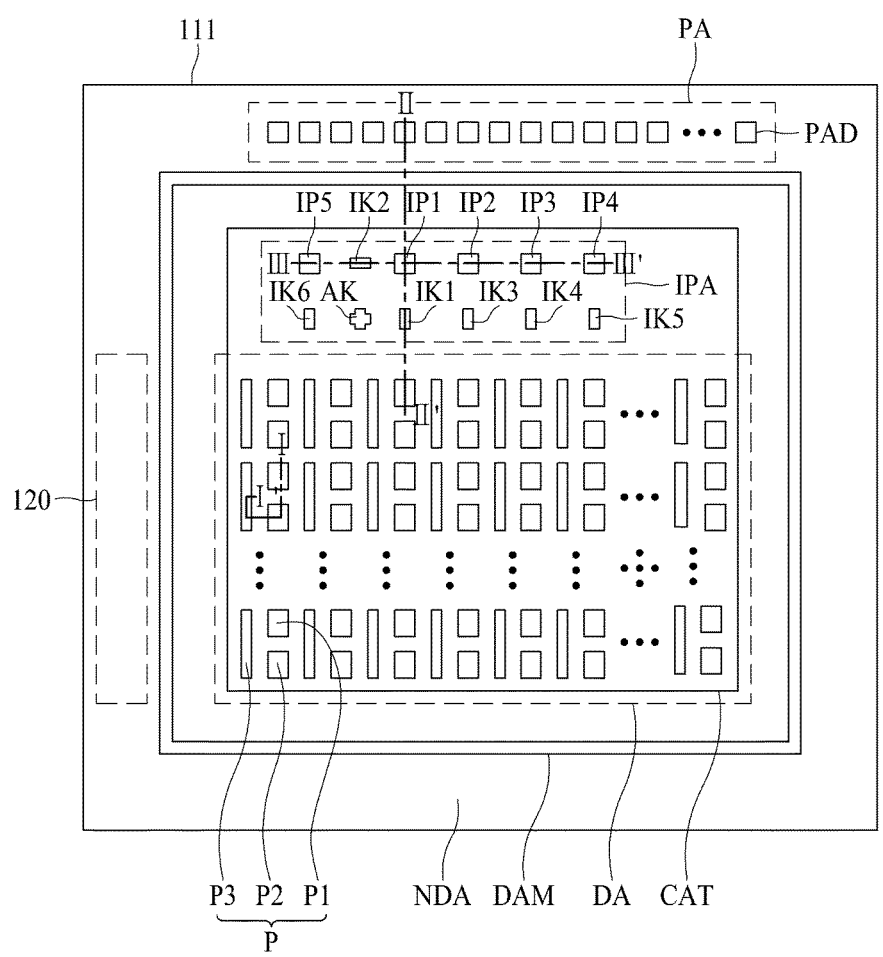
FIG. 3 illustrates one example showing a display area, a gate driver, an inspection pattern area, a second electrode, a pad area, and a dam on a first substrate of FIG. 2.

FIG. 3 illustrates one example showing a display area, a gate driver, an inspection pattern area, a second electrode, a pad area, and a dam on a first substrate of FIG. 2.

For convenience of explanation, FIG. 3 shows only the display area DA, the gate driver GD, the inspection pattern area IPA, the second electrode CAT, the pad area PA, and the dam DAM on the first substrate 111. With reference to FIG. 3, the first substrate 111 may be divided into the display area DA and the non-display area NDA. Pixels P for displaying an image may be in the display area DA. The inspection pattern area IPA, the pad area PA, the gate driver GD, and the second electrode CAT may be in the non-display area NDA. The inspection pattern area IPA may be provided with first to fifth inspection pixels IP1 to IP5, first to sixth inspection keys IK1 to IK6, and an alignment key AK. The pad area PA may be provided with pads.

The pixels P for displaying an image may be formed in the display area DA. Each of the pixels P may include first to third sub-pixels P1, P2, P3. Each of the first to third sub-pixels P1, P2, P3 is a light-emission area, which may be obtained by sequentially depositing a first electrode corresponding to an anode electrode, an organic light-emitting layer, and a second electrode corresponding to a cathode electrode, wherein holes and electrons may be respectively supplied from the first electrode and the second electrode, and may then be with each other in the organic light-emitting layer to emit light.

In the FIG. 3 example, the first sub-pixel P1 and the second sub-pixel P2 may be parallel to each other in a first direction (y-axis direction), and the third sub-pixel P3 may be adjacent to the first and second sub-pixels P1, P2 in a second direction (x-axis direction) crossing the first direction, but embodiments are not limited to this structure. For example, the first to third sub-pixels P1, P2, P3 may be parallel to one another in the first direction (y-axis direction), or the second direction (x-axis direction).

The example of FIG. 3 shows that the pixel P may include the first to third sub-pixels P1, P2, P3. For example, the first sub-pixels P1 may be a red pixel for emitting red light, the second sub-pixel P2 may be a green pixel for emitting green light, and the third sub-pixel P3 may be a blue pixel for emitting blue light, but embodiments are not limited to this structure. For example, the pixel P may further include a fourth sub-pixel in addition to the first to third sub-pixels P1, P2, P3. In one case, the first sub-pixels P1 may be a red pixel for emitting red light, the second sub-pixel P2 may be a green pixel for emitting green light, the third sub-pixel P3 may be a blue pixel for emitting blue light, and the fourth sub-pixel may be a white pixel for emitting white light.

The inspection pattern area IPA may be prepared in the non-display area NDA. The inspection pattern area IPA may be prepared in one peripheral side of the display area DA. For example, as shown in the FIG. 3 example, the inspection pattern area IPA may be prepared in one peripheral side of the display area DA adjacent to the pad area PA. That is, the inspection pattern area IPA may be prepared between the pad area PA and the display area DA.

The first to fifth inspection pixels IP1 to IP5, the first to sixth inspection keys IK1 to IK6, and the alignment key AK may be in the inspection pattern area IPA. The first to fifth inspection pixels IP1 to IP5 may have different shapes and sizes from those of the first to third sub-pixels P1, P2, P3. In the FIG. 3 example, each of the first to fifth inspection pixels IP1 to IP5 may have a square shape, and the first to third sub-pixels P1, P2, P3 may have a rectangular shape, but embodiments are not limited to this structure.

The first inspection pixel IP1 may be a sample pixel that may be provided to inspect an alignment of a first organic light-emitting layer in the first pixel P1, and may be disposed in the non-display area NDA. Accordingly, the first inspection pixel IP1 may not emit light. A first inspection organic light-emitting layer may be formed in the first inspection pixel IP1, wherein the first inspection organic light-emitting layer may include the same material as that of the first organic light-emitting layer of the first pixel P1.

The second inspection pixel IP2 may be a sample pixel that may be provided to inspect an alignment of a first hole transporting layer in the first pixel P1, and may be disposed in the non-display area NDA. Accordingly, the second inspection pixel IP2 may not emit light. A first inspection hole transporting layer may be formed in the second inspection pixel IP2, wherein the first inspection hole transporting layer may include the same material as that of the first hole transporting layer of the first pixel P1.

The third inspection pixel IP3 may be a sample pixel that may be provided to inspect an alignment of a second organic light-emitting layer in the second pixel P2, and may be disposed in the non-display area NDA. Accordingly, the third inspection pixel IP3 may not emit light. A second inspection organic light-emitting layer may be formed in the third inspection pixel IP3, wherein the second inspection organic light-emitting layer may include the same material as that of the second organic light-emitting layer of the second pixel P2.

The fourth inspection pixel IP4 may be a sample pixel that may be provided to inspect an alignment of a second hole transporting layer in the second pixel P2, and may be disposed in the non-display area NDA. Accordingly, the fourth inspection pixel IP4 may not emit light. A second inspection hole transporting layer may be formed in the fourth inspection pixel IP4, wherein the second inspection hole transporting layer may include the same material as that of the second hole transporting layer of the second pixel P2.

The fifth inspection pixel IP5 may be a sample pixel that may be provided to inspect an alignment of a third organic light-emitting layer in the third pixel P3, and may be disposed in the non-display area NDA. Accordingly, the fifth inspection pixel IP5 may not emit light. A third inspection organic light-emitting layer may be formed in the fifth inspection pixel IP5, wherein the third inspection organic light-emitting layer may include the same material as that of the third organic light-emitting layer of the third pixel P3.

The first inspection key IK1 may be provided to check an alignment of the first direction (y-axis direction) of the first inspection pixel IP1. Accordingly, the first inspection key IK1 may be extended in the first direction (y-axis direction). Also, the first inspection key IK1 may be parallel to the first inspection pixel IP1 and the first sub-pixel P1 in the first direction (y-axis direction). The first inspection key IK1 may be disposed between the first inspection pixel IP1 and the first sub-pixel P1 provided in the border of the display area DA.

The second inspection key IK2 may be provided to check an alignment of the second direction (x-axis direction) in each of the first to fifth inspection pixels IP1 to IP5. Accordingly, the second inspection key IK2 may be extended in the second direction (x-axis direction). Also, the second inspection key IK2 may be parallel to the first to fifth inspection pixels IP1 to IP5 in the second direction (x-axis direction).

The third inspection key IK3 may be provided to check an alignment of the first direction (y-axis direction) of the second inspection pixel IP2. Accordingly, the third inspection key IK3 may be extended in the first direction (y-axis direction). Also, the third inspection key IK3 may be parallel to the second inspection pixel IP2 and the first sub-pixel P1 in the first direction (y-axis direction). The third inspection key IK3 may be disposed between the second inspection pixel IP2 and the first sub-pixel P1 provided in the border of the display area DA.

The fourth inspection key IK4 may be provided to check an alignment of the first direction (y-axis direction) of the third inspection pixel IP3. Accordingly, the fourth inspection key IK4 may be extended in the first direction (y-axis direction). Also, the fourth inspection key IK4 may be parallel to the third inspection pixel IP3 and the second sub-pixel P2 in the first direction (y-axis direction). The fourth inspection key IK4 may be disposed between the third inspection pixel IP3 and the second sub-pixel P2 provided in the border of the display area DA.

The fifth inspection key IK5 may be provided to check an alignment of the first direction (y-axis direction) of the fourth inspection pixel IP4. Accordingly, the fifth inspection key IK5 may be extended in the first direction (y-axis direction). Also, the fifth inspection key IK5 may be parallel to the fourth inspection pixel IP4 and the second sub-pixel P2 in the first direction (y-axis direction). The fifth inspection key IK5 may be disposed between the fourth inspection pixel IP4 and the second sub-pixel P2 provided in the border of the display area DA.

The sixth inspection key IK6 may be provided to check an alignment of the first direction (y-axis direction) of the fifth inspection pixel IP5. Accordingly, the sixth inspection key IK6 may be extended in the first direction (y-axis direction). Also, the sixth inspection key IK6 may be parallel to the fifth inspection pixel IP5 and the third sub-pixel P3 in the first direction (y-axis direction). The sixth inspection key IK6 may be disposed between the fifth inspection pixel IP5 and the third sub-pixel P3 provided in the border of the display area DA.

The alignment key AK may be provided to align a mask for forming the first to third organic light-emitting layers, or the first and second hole transporting layers. The alignment key AK may be formed in a cross shape, but embodiments are not limited to this shape.

The pad area PA may be provided with the plurality of pads PAD. The pad area PA may be disposed at one side of the first substrate 111. The plurality of pads PAD may be electrically connected with lines of the flexible film 140 by the use of anisotropic conducting film.

The gate driver GD may be disposed in the outer area of the other side of the display area DA, or may be disposed in the outer area of both sides of the display area DA. The gate driver GD may be formed in a gate-driver-in-panel (GIP) method including a plurality of thin film transistors.

The second electrode CAT may cover the first to fifth inspection pixels IP1 to IP5 of the inspection pattern area IPA, as well as the pixels P of the display area DA. As the first and second inspection hole transporting layers provided in the second and fourth inspection pixels IP2, IP4 are formed of a transparent material, the first and second inspection hole transporting layers may have low visibility for the alignment inspection. However, if the second electrode CAT covers the first to fifth inspection pixels IP1 to IP5, the first and second inspection hole transporting layers provided in the second and fourth inspection pixels IP2, IP4 may be easily visible by the metal reflection of the electrodes for the thin film transistors.

The dam DAM may be provided between the display area DA and the pad area PA, wherein the dam DAM may prevent an organic film for an encapsulation film from overflowing into the pad area PA. The dam DAM may surround the display area DA.

The inspection pattern area IPA may be covered by the second electrode CAT, and the second electrode CAT may be covered by the encapsulation film, whereby the inspection pattern area IPA may be provided between the display area DA and the dam DAM.

As described above, the inspection organic light-emitting layers for the alignment inspection may be provided on the non-display area of the first substrate provided with the thin film transistors. As a result, it may be possible to omit an inspection substrate, to thereby reduce a manufacturing cost. Also, the inspection hole transporting layers for the alignment inspection may be provided in the non-display area of the first substrate, whereby it may be possible to inspect the alignment of the hole transporting layers, as well as the organic light-emitting layers.

Also, the first to sixth inspection keys may be provided in the non-display area of the first substrate. Foe example, the first, third, fourth, fifth, and sixth inspection keys may be provided in the first direction, and the second inspection key may be provided in the second direction crossing to the first direction while being parallel to the first to fifth inspection pixels. Therefore, it may be possible to inspect the alignment of the inspection organic light-emitting layers of the first to fifth inspection pixels and the alignment for the first direction of the inspection hole transporting layers by the use of first, third, fourth, fifth, and sixth inspection keys, and to inspect the alignment for the second direction by the use of second inspection key.

Figure 4:
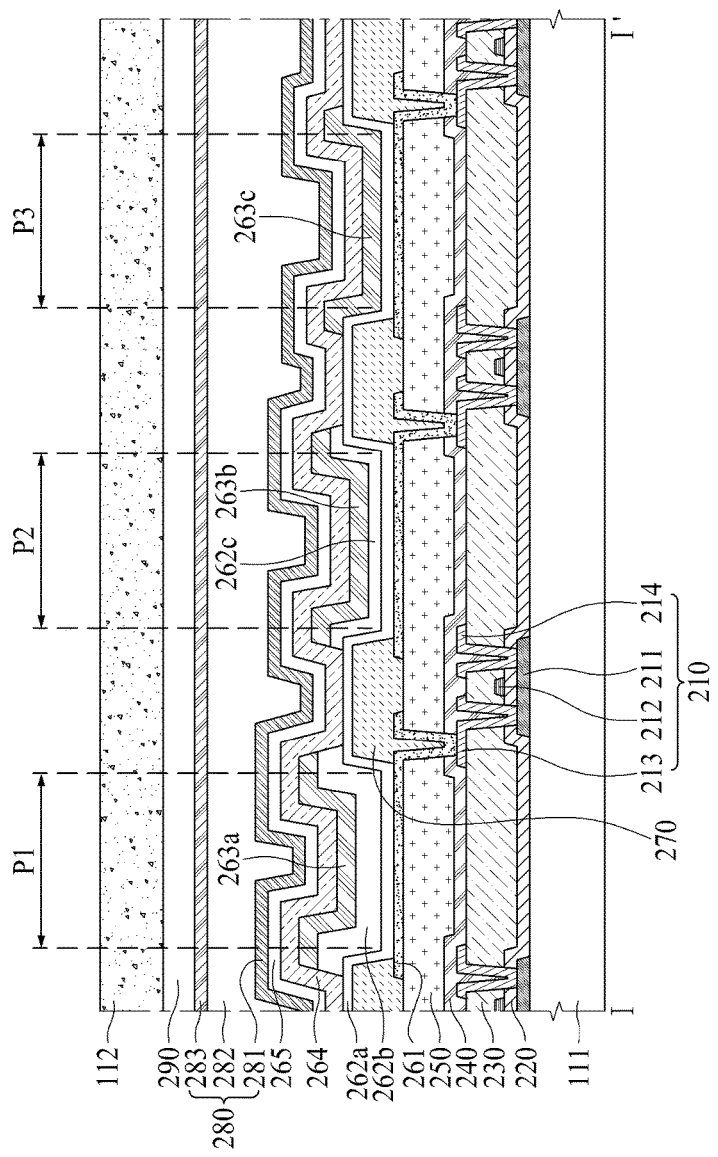
FIG. 4 is a cross-sectional view taken along line I-I' of FIG. 3.
Figure 5:
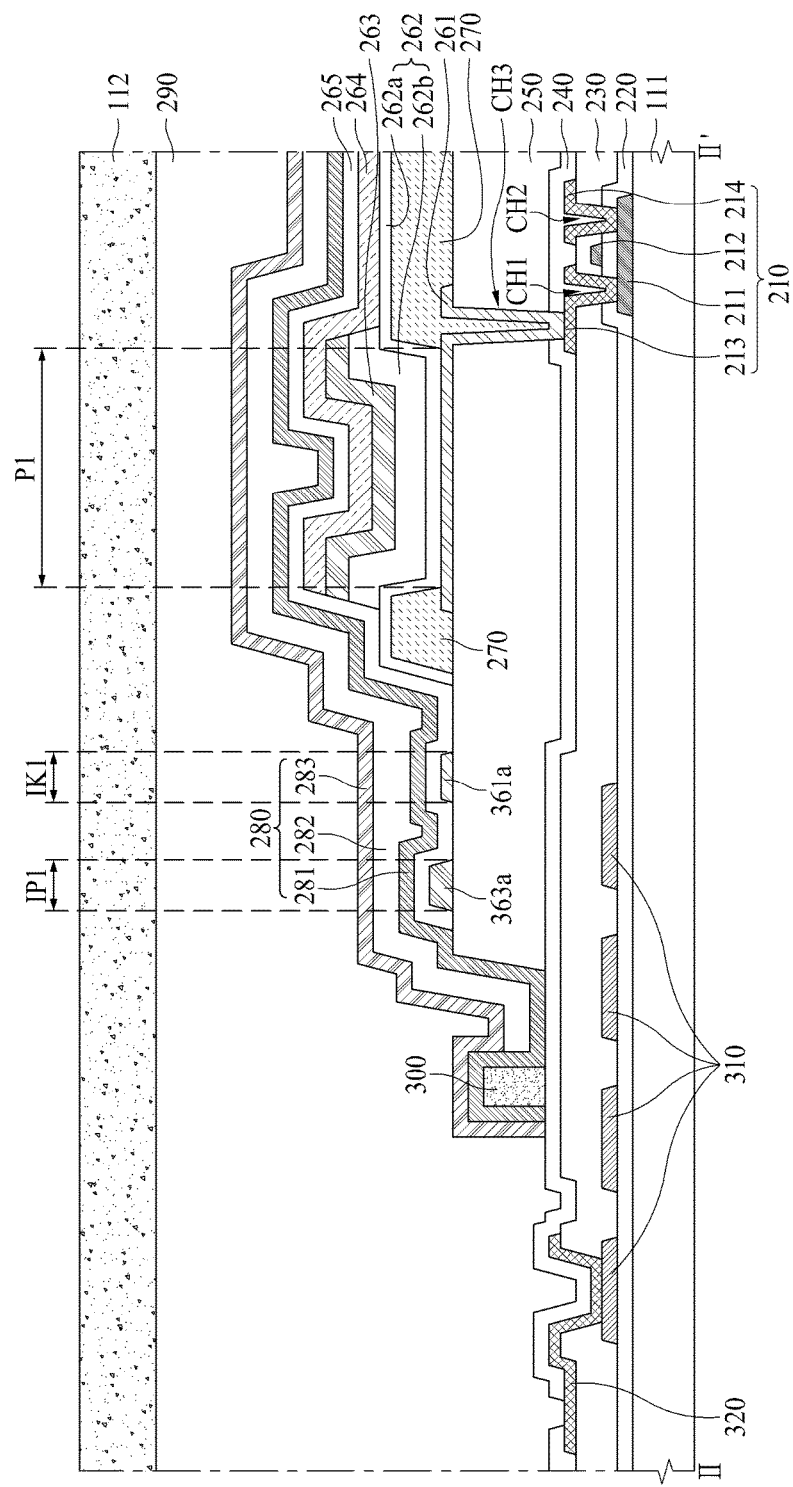
FIG. 5 is a cross-sectional view taken along line II-II' of FIG. 3.
Figure 6:
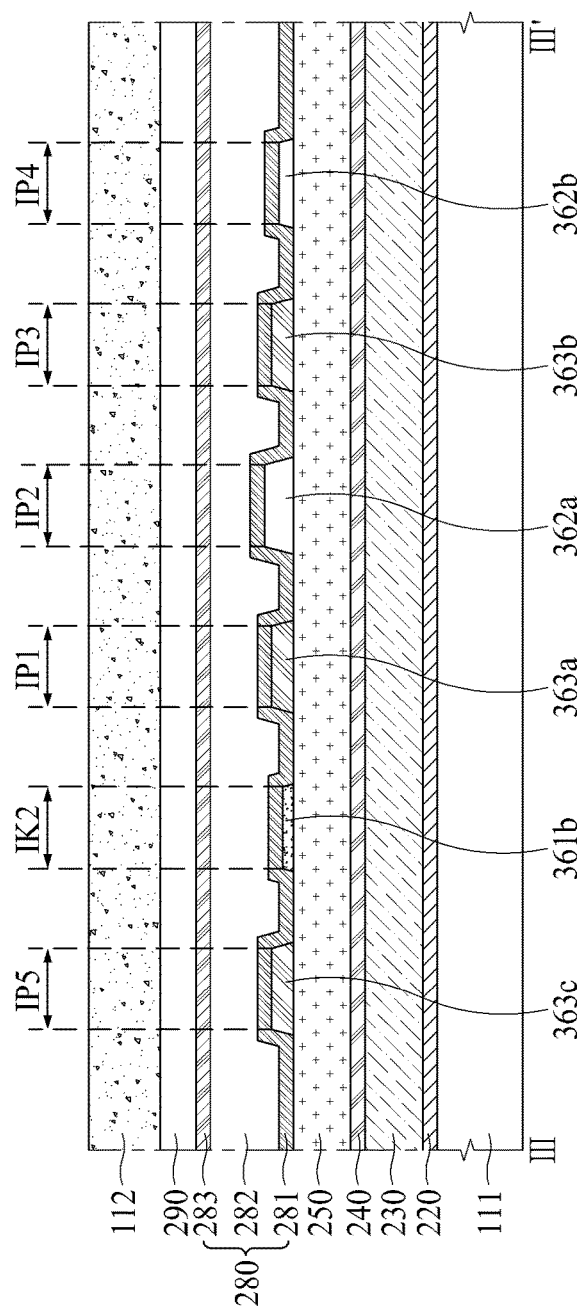
FIG. 6 is a cross-sectional view taken along line III-III' of FIG. 3.

FIG. 4 is a cross-sectional view taken along line I-I' of FIG. 3. FIG. 5 is a cross-sectional view taken along line II-II' of FIG. 3. FIG. 6 is a cross-sectional view taken along line III-III' of FIG. 3.

The example of FIG. 4 shows the first to third sub-pixels P1, P2, P3 of the display area DA of FIG. 3. The example of FIG. 5 shows the first sub-pixel P1 of the display area DA, the first inspection key IK1, and the first inspection pixel IP1 of the inspection pattern area IPA, and the pad PAD of the pad area PA. The example of FIG. 6 shows the second inspection key IK2 and the first to fifth inspection pixels IP1 to IP5 of the inspection pattern area IPA. Hereinafter, the first to third sub-pixels P1, P2, P3 of the display area DA, the inspection pattern area IPA, and the pad area PA will be described in detail with reference to FIGS. 4 to 6.

First, the first to third sub-pixels P1, P2, P3 of the display area DA will be described in detail with reference to FIG. 4. With reference to the FIG. 4 example, a buffer film may be provided on one surface of the first substrate 111. The buffer film may be provided on one surface of the first substrate 111 to protect thin film transistors 210 and organic light-emitting devices 260 from moisture permeating through the first substrate 111, which may be vulnerable to moisture permeability. Herein, one surface of the first substrate 111 may confront or face the second substrate 112. The buffer film may be formed of a plurality of inorganic films alternately deposited. For example, the buffer film may be formed in a multi-layered structure by alternately depositing at least one inorganic film, such as a silicon oxide film (SiO$_x$), a silicon nitride film (SiN$_x$), and/or silicon oxynitride (SiON). It may be possible to omit the buffer film.

The thin film transistor 210 may be provided on the buffer film. The thin film transistor 210 may include an active layer 211, a gate electrode 212, a source electrode 213, and a drain electrode 214. In the example of FIG. 4, the thin film transistor 210 may be provided in a top-gate type in which the gate electrode 212 is positioned above the active layer 211, but embodiments are not limited to this type. For example, the thin film transistor 210 may be provided in a bottom-gate type in which the gate electrode 212 is positioned below the active layer 211, or a double-gate type in which the gate electrode 212 is positioned both above and below the active layer 211.

The active layer 211 may be provided on the buffer film. The active layer 211 may be formed a silicon-based semiconductor material or an oxide-based semiconductor material. A light shielding layer may be additionally provided between the buffer film and the active layer 211 to block external light being incident on the active layer 211.

A gate insulating film 220 may be provided on the active layer 211. The gate insulating film 220 may be formed in a single-layered structure of the inorganic insulating material, such as silicon oxide (SiO$_x$) or silicon nitride (SiN$_x$), or a multi-layered structure of the above silicon oxide (SiO$_x$) and silicon nitride (SiN$_x$).

The gate electrode 212 and gate line may be provided on the gate insulating film 220. The gate electrode 212 and gate line may be formed in a single-layered structure or multi-layered structure, including, for example, molybdenum (Mo), aluminum (Al), chrome (Cr), aurum (Au), titanium (Ti), nickel (Ni), neodymium (Nd), copper (Cu), and their alloys.

An insulating interlayer 230 may be provided on the gate electrode 212 and gate line. The insulating interlayer 230 may be formed in a single-layered structure of the inorganic insulating material such as silicon oxide (SiO$_x$) or silicon nitride (SiN$_x$), or a multi-layered structure of the above silicon oxide (SiO$_x$), silicon nitride (SiN$_x$) and their alloys.

The source electrode 213, the drain electrode 214, and the data line may be provided on the insulating interlayer 230. Each of the source electrode 214 and the drain electrode 214 may be connected with the active layer 211 via a contact hole penetrating through the gate insulating film 220 and the insulating interlayer 230. The source electrode 213, the drain electrode 214, and the data line may be formed in a single-layered structure or multi-layered structure, including, for example, molybdenum (Mo), aluminum (Al), chrome (Cr), aurum (Au), titanium (Ti), nickel (Ni), neodymium (Nd), copper (Cu), and their alloys.

A protection film 240 for an insulation of the thin film transistor 210 may be provided on the source electrode 213, the drain electrode 214, and the data line. The protection film 240 may be formed in a single-layered structure of the inorganic material, such as silicon oxide (SiO$_x$) or silicon nitride (SiN$_x$), or a multi-layered structure of the above silicon oxide (SiO$_x$) and silicon nitride (SiN$_x$).

A planarization film 250 may be provided on the protection film 240 to planarize a step difference area caused by the thin film transistor 210. The planarization film 250 may be formed of an organic material, for example, acryl resin, epoxy resin, phenolic resin, polyamide resin, polyimide resin, etc.

An organic light-emitting device 260 and a bank 270 may be provided on the planarization film 250. The organic light-emitting device 260 may include hole transporting layers 262a, 262b, 262c, organic light-emitting layers 263a, 263b, 263c, an electron transporting layer 264, and a second electrode 265. The first electrode 261 may serve as an anode electrode, and the second electrode 263 may serve as a cathode electrode.

The first electrode 261 may be provided on the planarization film 250. The first electrode 261 may be connected with the source electrode 213 of the thin film transistor 210 via a contact hole penetrating through the protection film 240 and the planarization film 250. The first electrode 261 may be formed of a metal material with high reflectance, for example, a deposition structure of aluminum and titanium (Ti/Al/Ti), a deposition structure of aluminum and indium tin oxide (ITO/AL/ITO), an APC alloy, and a deposition structure of APC alloy and indium tin oxide (ITO/APC/ITO). Herein, the APC alloy may be an alloy of silver (Ag), palladium (Pd), and copper (Cu).

The bank 270 may be provided to cover the edge of the first electrode 261 on the planarization film 250, to thereby divide the sub-pixels P1, P2, P3. That is, the bank 270 may function as a pixel-defining film to define the sub-pixels P1, P2, P3.

Each of the sub-pixels P1, P2, P3 may indicate a light-emission area, wherein the first electrode 261 corresponding to the anode electrode, the organic light-emitting layer 262a/262b/262c, and the second electrode 262 corresponding to the cathode electrode may be sequentially deposited in each sub-pixel. Holes and electrons may be respectively supplied from the first electrode and the second electrode, and may then be combined with each other in the organic light-emitting layer 262a/262b/262c to emit light. For example, the area for the bank 270 may not emit light, whereby the area for the bank 270 may be defined as a non-emission area. The bank 270 may be formed of an organic material, for example, acryl resin, epoxy resin, phenolic resin, polyamide resin, polyimide resin, etc.

The common hole transporting layer 262a may be provided on the first electrode 261. The common hole transporting layer 262a may be a common layer provided in the sub-pixels P1, P2, P3. The first hole transporting layer 262b may be provided on the common hole transporting layer 262a of the first sub-pixel P1, and the second hole transporting layer 262c may be provided on the common hole transporting layer 262a of the second sub-pixel P2. The common hole transporting layer 262a and the first and second hole transporting layers 262b and 262c may smoothly transfer the hole injected from the first electrode 261 or p-type charge generation layer 262c to the light-emitting layer.

Each of the common hole transporting layer 262a, the first hole transporting layer 262b, and the second hole transporting layer 262c may be formed, e.g., of NPD(N,N-dinaphthyl-N,N'-diphenyl benzidine), TPD(N,N'-bis-(3-methylphenyl)-N,N'-bis-(phenyl)-benzidine), TCTA(4-(9H-carbazol-9-yl)-N,N-bis[4-(9H-carbazol-9-yl)phenyl]-benzenamine), CBP(4,4'-N,N'-dicarbazole-biphenyl), s-TAD, or MTDATA(4,4',4'''-Tris(N-3-methylphenyl-N-phenyl-amino)-triphenylamine), but embodiments are not limited to these materials.

A thickness of the first hole transporting layer 262b may be different from a thickness of the second hole transporting layer 262c. For example, as shown in FIG. 4, a thickness of the first hole transporting layer 262b may be larger than a thickness of the second hole transporting layer 262c.

The common hole transporting layer 262a and the first hole transporting layer 262b may be provided in the first sub-pixel P1. The common hole transporting layer 262a and the second hole transporting layer 262c may be provided in the second sub-pixel P2. Only the common hole transporting layer 262a may be provided in the third sub-pixel P3. Accordingly, it may be possible to optimize a micro-cavity distance in each of the first to third sub-pixels P1, P2, P3 by properly adjusting a thickness of the common hole transporting layer 262a, a thickness of the first hole transporting layer 262b, and a thickness of the second hole transporting layer 262c. Herein, the micro-cavity indicates that the light-emission efficiency is improved by amplification and constructive interference of the light through repetitive reflection and re-reflection of the light emitted from the organic light-emitting layer 262 between the first electrode 261 corresponding to a reflective electrode and the second electrode 263 corresponding to a semi-transmissive electrode. The thickness of the common hole transporting layer 262a, the thickness of the first hole transporting layer 262b, and the thickness of the second hole transporting layer 262c may be designed in an optimum range through a pretest in consideration of a wavelength of the light emitted from the pixels, and a distance between the first electrode 261 and the semi-transmissive electrode 300.

The first organic light-emitting layer 263a may be provided on the first hole transporting layer 262b of the first sub-pixel P1. The first organic light-emitting layer 263a may include a material for emitting first-color light, which may be formed of a phosphorescent or fluorescent material.

The second organic light-emitting layer 263b may be provided on the second hole transporting layer 262c of the second sub-pixel P2. The second organic light-emitting layer 263b may include a material for emitting second-color light, which may be formed of a phosphorescent or fluorescent material.

The third organic light-emitting layer 263c may be provided on the common hole transporting layer 262a of the third sub-pixel P3. The third organic light-emitting layer 263c may include a material for emitting third-color light, which may be formed of a phosphorescent or fluorescent material.

The electron transporting layer 264 may be provided on the first to third organic light-emitting layers 263a, 263b, 263c. The electron transporting layer 264 may be a common layer provided in the sub-pixels P1, P2, P3. The electron transporting layer 264 may transfer the electron injected from the second electrode 263 to the organic light-emitting layer.

The electron transporting layer 264 may be formed of, e.g., PBD(2-(4-biphenyl)-5-(4-tert-butylphenyl)-1,3,4-oxadiazole), TAZ(3-(4-biphenyl)-4-phenyl-5-tertbutylphenyl-1,2,4-triazole), Liq(8-hydroxyquinolinolato-lithium), BAlq (Bis(2-methyl-8-quinolinolate)-4-(phenylphenolato) aluminium), or TPBi(2,2',2'-(1,3,5-benzinetriyl)-tris(1-phenyl-1-H-benzimidazole), but is not limited to these materials.

The second electrode 265 may be provided on the first to third organic light-emitting layers 263a, 263b, 263c. The second electrode 263 may be a common layer provided in the sub-pixels P1, P2, P3. To realize a micro-cavity structure, the second electrode 265 may be formed of a semi-transmissive conductive material, such as magnesium (Mg), silver (Ag), or alloy of magnesium (Mg) and silver (Ag). A capping layer may be provided on the second electrode 265.

An encapsulation film 280 may be provided on the second electrode 263. The encapsulation film 280 may reduce or prevent a permeation of oxygen or moisture into the organic light-emitting layer 262 and the second electrode 265. The encapsulation film 280 may include at least one inorganic film. The inorganic film may be formed of, for example, silicon nitride, aluminum nitride, zirconium nitride, titanium nitride, hafnium nitride, tantalum nitride, silicon oxide, aluminum oxide, and/or titanium oxide.

Also, the encapsulation film 280 may include at least one organic film. The organic film may be formed at a thickness enough to reduce or prevent particles from getting into the organic light-emitting layer 262 and the second electrode 265 through the encapsulation film 280.

Then, an adhesion layer 290 may be prepared on the encapsulation film 280. The adhesion layer 290 may be provided to adhere the encapsulation film 280 to the second substrate 112, whereby the first substrate 111 and the second substrate 112 may be bonded to each other. The adhesion layer 290 may be a transparent adhesion film or transparent adhesion resin. The second substrate 112 may be a plastic film, a glass substrate, or an encapsulation film (protection film).

Secondly, the first inspection key IK1 and the first inspection pixel IP1 of the inspection pattern area IPA, the pad PAD of the pad area PA, and the dam 300 will be described in detail with reference to FIG. 5. With reference to the FIG. 5 example, the first inspection pixel IP1 may include the first inspection organic light-emitting layer 363a, wherein the first inspection organic light-emitting layer 363a may include the same material as that of the first organic light-emitting layer 263a of the first pixel P1. The first inspection organic light-emitting layer 363a may include a material for emitting first-color light, which may be formed of a phosphorescent or fluorescent material. The first inspection organic light-emitting layer 363a may be disposed on the planarization film 250.

The first inspection key 361a may be formed of the same material as that of the first electrode 261. For example, the first inspection key 361a may be formed of a metal material, for example, a deposition structure of aluminum and titanium (Ti/Al/Ti), a deposition structure of aluminum and indium tin oxide (ITO/AL/ITO), an APC alloy, and a deposition structure of APC alloy and indium tin oxide (ITO/APC/ITO).

The first inspection key 361a may be disposed on the planarization film 250. The first inspection key 361a may be disposed between the first inspection organic light-emitting layer 363a and the display area DA.

In the example of FIG. 3, the inspection pattern area IPA may be provided between the display area DA and the pad area PA, whereby each of the first inspection organic light-emitting layer 363a and the first inspection key 361a may be overlapped with data link lines 310. That is, the inspection pattern area IPA may be overlapped with the data link lines 310. The data link lines 310 may connect the pad 320 of the pad area PA with the data lines of the display area DA. The data link lines 310 may be provided on the gate insulating film 220, and may be positioned in the same layer as that of the gate electrode 212, and may be formed of the same material as that of the gate electrode 212. That is, the data link lines 310 and the gate electrode 212 may be manufactured by the same process.

The pad 320 of the display area DA may be provided on the insulating interlayer 230, and may be formed of the same material as those of the source electrode 213 and the drain electrode 214. The pad 320 may be connected with the data link line 310 via a contact hole penetrating through the gate insulating film 230. Also, the pad 320 may be exposed via a contact hole penetrating through the insulating interlayer 230, whereby the pad 320 may be electrically connected with the flexible film 140 through the use of anisotropic conducting film.

The dam 300 may reduce or prevent the organic film 282 of the encapsulation film 280 from overflowing into the pad area PA. The first and second inorganic films 281 and 283 of the encapsulation film 280 may be covered by the dam 300. However, the organic film 282 may be provided at one side of the dam 300. A height of the dam 300 may be greater than a height of the organic film 282.

Thirdly, the second inspection key IK2 and the first to fifth inspection pixels IP1 to IP5 of the inspection pattern area IPA will be described in detail with reference to FIG. 6. With reference to the example of FIG. 6, the first inspection pixel IP1 may include the first inspection organic light-emitting layer 363a, which may include the same material as that of the first organic light-emitting layer 263a of the first sub-pixel P1. The first inspection organic light-emitting layer 363a may include the material for emitting the first-color light, which may be formed of the phosphorescent or fluorescent material. The second inspection pixel IP2 may include the first inspection hole transporting layer 362a, which may include the same material as that of the first hole transporting layer 362b of the first sub-pixel P1.

The third inspection pixel IP3 may include the first inspection organic light-emitting layer 363a, which may include the same material as that of the second organic light-emitting layer 263a of the second sub-pixel P2. The first inspection organic light-emitting layer 363a may include the material for emitting the second-color light, which may be formed of the phosphorescent or fluorescent material. The fourth inspection pixel IP4 may include the second inspection hole transporting layer 362b, which may include the same material as that of the second hole transporting layer 362c of the second sub-pixel P2.

The fifth inspection pixel IP5 may include the third inspection organic light-emitting layer 363c, which may include the same material as that of the third organic light-emitting layer 263c of the third sub-pixel P3. The third inspection organic light-emitting layer 363c may include the material for emitting the third-color light, which may be formed of the phosphorescent or fluorescent material.

The thickness of the first hole transporting layer 262b may be different from the thickness of the second hole transporting layer 262c, whereby a thickness of the first inspection hole transporting layer 362a may be different from a thickness of the second inspection hole transporting layer 362b. For example, the thickness of the first inspection hole transporting layer 362a may be larger than the thickness of the second inspection hole transporting layer 362b.

Each of the first and second inspection hole transporting layers 362a and 362b may be formed of, e.g., NPD(N,N-dinaphthyl-N,N'-diphenyl benzidine), TPD(N,N'-bis-(3-methylphenyl)-N,N'-bis-(phenyl)-benzidine), TCTA(4-(9H-carbazol-9-yl)-N,N-bis[4-(9H-carbazol-9-yl)phenyl]-benzenamine), CBP(4,4'-N,N'-dicarbazole-biphenyl), s-TAD, or MTDATA(4,4',4"-Tris(N-3-methylphenyl-N-phenyl-amino)-triphenylamine), but embodiments are not limited to these materials.

The second inspection key 361b may be formed of the same material as that of the first electrode 261. For example, the second inspection key 361b may be formed of a metal material, for example, a deposition structure of aluminum and titanium (Ti/Al/Ti), a deposition structure of aluminum and indium tin oxide (ITO/AL/ITO), an APC alloy, and a deposition structure of APC alloy and indium tin oxide (ITO/APC/ITO). The second inspection key 361b may be parallel to the first to third inspection organic light-emitting layers 363a, 363b, 363c, and the first and second inspection hole transporting layers 362a, 362b.

Meanwhile, the examples of FIGS. 5 and 6 show only the first and second inspection keys 361a and 361b. Even though not shown, the third to sixth inspection keys IK3 to IK6 and the alignment key AK may be provided in the same layer as that of the first electrode 261, and may be formed of the same material as that of the first electrode 261. For example, the first to sixth inspection keys IK1 to IK6 and the alignment key AK may be manufactured at the same time by the process of forming the first electrode 261, whereby there may be no additional process for forming the first to sixth inspection keys IK1 to IK6 and the alignment key AK. The first to third inspection organic light-emitting layers 363a, 363b, 363c; the first and second inspection hole transporting layers 362a, 362b; and the second inspection key 361b may be disposed on the planarization film 250.

In the FIG. 3 example, the inspection pattern area IPA may be provided between the display area DA and the pad area PA, whereby each of the first to third inspection organic light-emitting layers 363a, 363b, 363c; the first and second inspection hole transporting layers 362a, 362b; and the second inspection key 361b may be overlapped with the data link line 310. The data link lines 310 may connect the pad 320 of the pad area PA with the data lines of the display area DA. The data link lines 310 may be provided on the gate insulating film 220, and may be positioned in the same layer as that of the gate electrode 212, and may be formed of the same material as that of the gate electrode 212. That is, the data link lines 310 and the gate electrode 212 may be manufactured by the same process.

Also, the example of FIG. 3 shows that the inspection pattern area IPA may be disposed between the display area DA and the pad area PA. For example, the alignment key AK, the first to sixth inspection keys IK1 to IK6, and the first to fifth inspection pixels IP1 to IP5 of the inspection pattern area IP1 may overlap the data link lines 310 for connecting the data lines of the display area DA with the pads PAD of the pad area PA, as shown in the examples of FIGS. 5 and 6.

Figure 7:
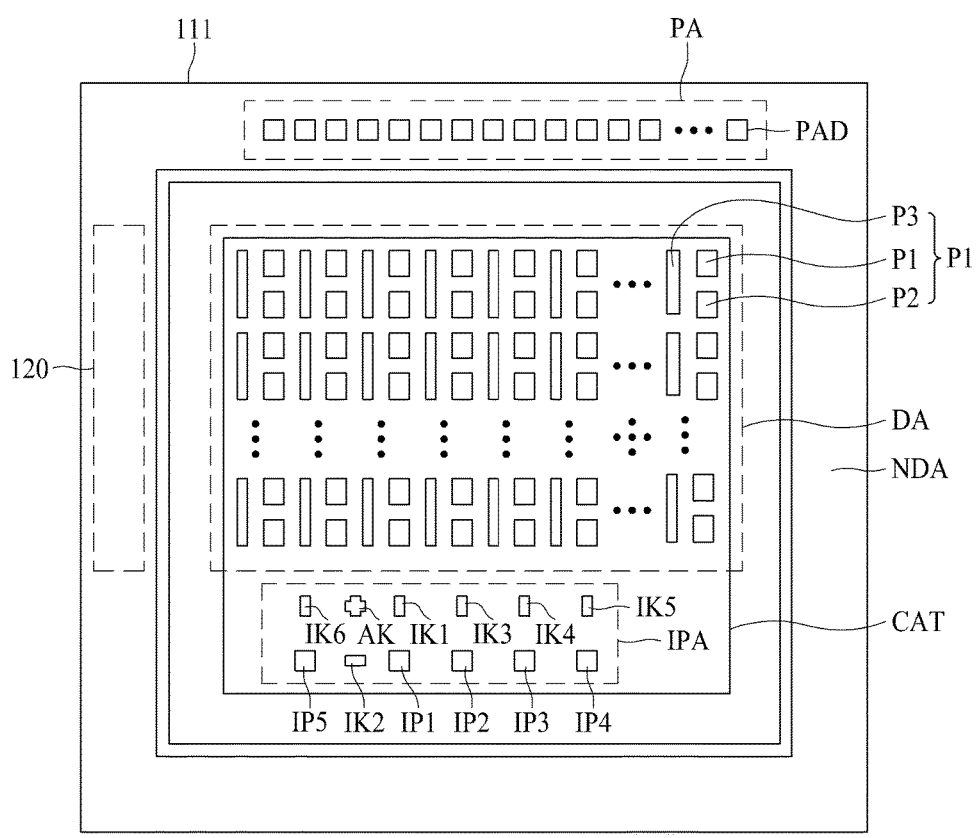
FIG. 7 illustrates another example showing a display area, a gate driver, an inspection pattern area, a second electrode, a pad area, and a dam on the first substrate of FIG. 2.
Figure 8:
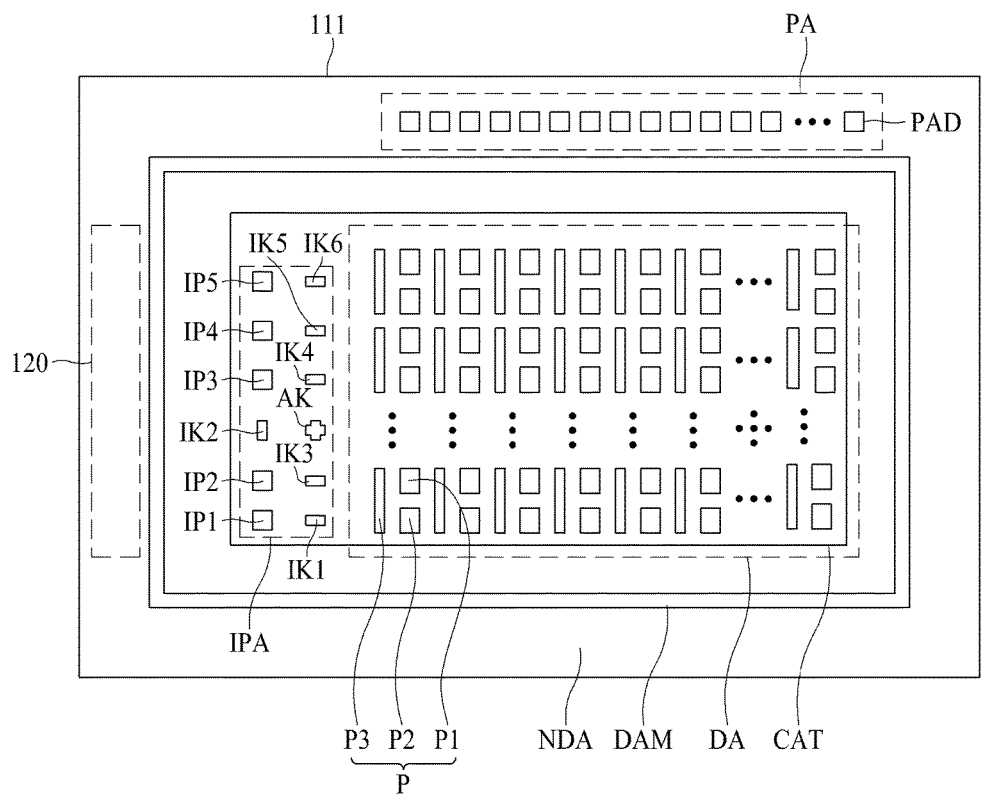
FIG. 8 illustrates another example showing a display area, a gate driver, an inspection pattern area, a second electrode, a pad area, and a dam on the first substrate of FIG. 2.

FIG. 7 illustrates another example showing a display area, a gate driver, an inspection pattern area, a second electrode, a pad area, and a dam on the first substrate of FIG. 2. FIG. 8 illustrates another example showing a display area, a gate driver, an inspection pattern area, a second electrode, a pad area, and a dam on the first substrate of FIG. 2.

As shown in the FIG. 7 example, the pad area PA may be disposed at one side of the first substrate 111, and the inspection pattern area may be disposed at the opposite side of the first substrate 111. For example, the inspection pattern area IPA may not be disposed between the pad area PA and the display area DA, whereby the alignment key AK, the first to sixth inspection keys IK1 to IK6, and the first to fifth inspection pixels IP1 to IP5 of the inspection pattern area IP1 may not overlap the data link lines 310.

As shown in the FIG. 8 example, the inspection pattern area IPA may be disposed between the gate driver 120 and the display area DA, or the inspection pattern area IPA may be disposed at the side, which may be opposite to one side of the first substrate 111 where the gate driver 120 may be provided. For example, the inspection pattern area IPA may overlap the gate lines for connecting the display area DA with the gate driver 120. Also, the inspection pattern area IPA may not be disposed between the pad area PA and the display area DA, whereby the first to sixth inspection keys IK1 to IK6 and the first to fifth inspection pixels IP1 to IP5 of the inspection pattern area IPA may not overlap the data link lines 310.

Figure 9:
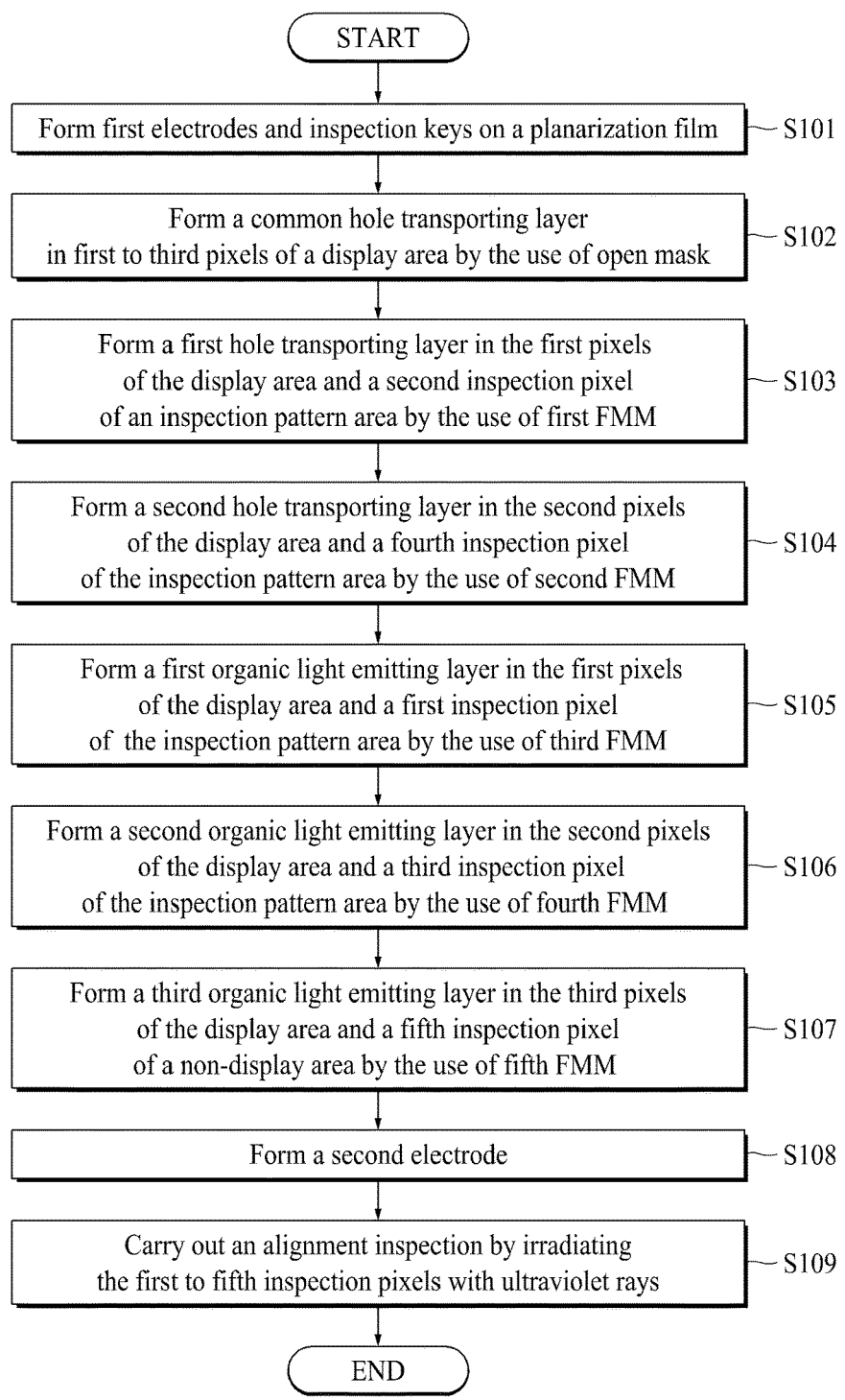
FIG. 9 is a flow chart illustrating a method for manufacturing an OLED device according to an embodiment of the present disclosure.

FIG. 9 is a flow chart illustrating a method for manufacturing an OLED device according to an embodiment of the present disclosure. FIGS. 10A to 10F are plane views illustrating an open mask and first to fifth fine metal masks (FMMs) disposed on a first substrate.

The examples of FIGS. 10A to 10F show the first substrate, which may be exposed by openings of an open mask OM and first to fifth FMM FMM1 to FMM5. As shown in the FIG. 10A example, the display area DA of the first substrate 111 may not be covered, but may be exposed by the opening of the open mask OM. As shown in the FIG. 10B example, the second inspection pixel IP2 and the first sub-pixels P1 of the first substrate 111 may not be covered, but may be exposed by the opening of the first FMM FMM1. As shown in the FIG. 10C example, the fourth inspection pixel IP4 and the second sub-pixels P2 of the first substrate 111 may not be covered, but may be exposed by the opening of the second FMM FMM2. The first inspection pixel IP1 and the first sub-pixels P1 of the first substrate 111 may not be covered, but may be exposed by the opening of the third FMM FMM3. The third inspection pixel IP3 and the second sub-pixels P2 of the first substrate 111 may not be covered, but may be exposed by the opening of the fourth FMM FMM4. The fifth inspection pixel IP5 and the third sub-pixels P3 of the first substrate 111 may not be covered, but may be exposed by the opening of the fifth FMM FMM5.

Hereinafter, a method for manufacturing the OLED device according to an embodiment of the present disclosure will be described in detail with reference to the examples of FIGS. 9 to 10F. Firstly, the first electrodes 261, the first to sixth inspection keys IK1 to IK6, and the alignment key AK may be provided on the thin film transistors 210 prepared on the first substrate 111, and the planarization film 250 for covering the thin film transistors 210.

The first electrode 261 may be connected with the source electrode 213 of the thin film transistor 210 via the contact hole penetrating through the protection film 240 and the planarization film 250. The first electrodes 261, the first to sixth inspection keys IK1 to IK6, and the alignment key AK may be formed of a metal material, for example, a deposition structure of aluminum and titanium (Ti/Al/Ti), a deposition structure of aluminum and indium tin oxide (ITO/AL/ITO), an APC alloy, and a deposition structure of APC alloy and indium tin oxide (ITO/APC/ITO).

The first to sixth inspection keys IK1 to IK6 and the alignment key AK may be positioned in the same layer as that of the first electrode 261, and may be formed of the same material as that of the first electrode 261. In this case, the first to sixth inspection keys IK1 to IK6 and the alignment key AK may be manufactured at the same time by the process of forming the first electrode 261, whereby there may be no additional process for forming the first to sixth inspection keys IK1 to IK6 and the alignment key AK.

Then, the bank 270 may be provided to cover the edge of the first electrode 261 on the planarization film 250 to divide the sub-pixels P1, P2, P3. The bank 270 may be formed of an organic material, for example, acryl resin, epoxy resin, phenolic resin, polyamide resin, polyimide resin, etc. See operation S101 of the example of FIG. 9.

Figure 10A:
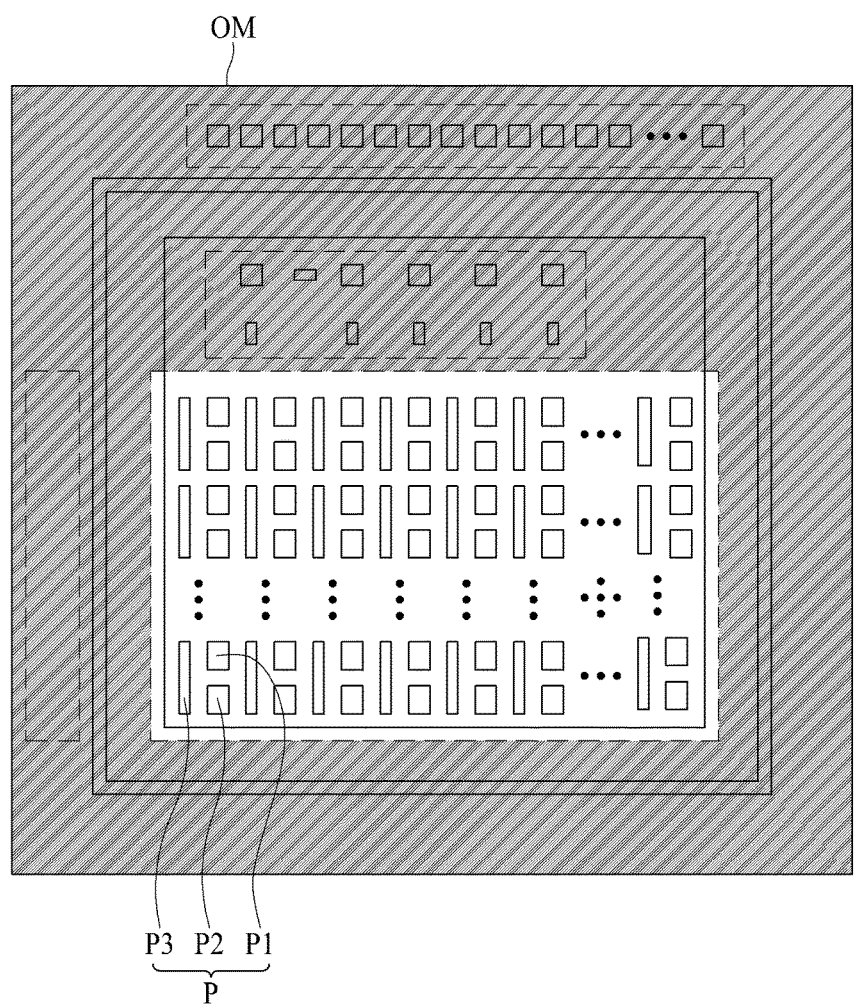
FIGS. 10A to 10F are plane views illustrating an open mask and first to fifth fine metal masks (FMMs) disposed on a first substrate.

Secondly, as shown in the FIG. 10A example, a first open mask OM having the opening corresponding to the display area DA may be aligned on the first substrate 111, to thereby form the common hole transporting layer 262a in the first to third sub-pixels P1, P2, P3 of the display area DA. See operation S102 of the example of FIG. 9.

Figure 10B:
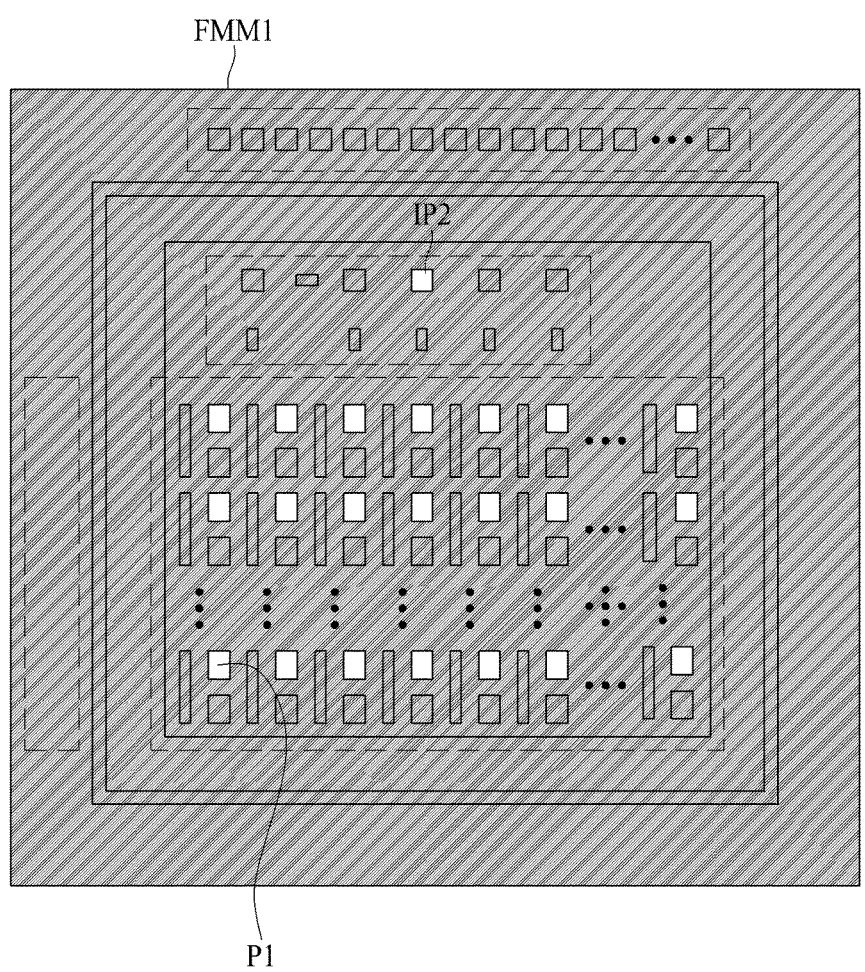

Thirdly, as shown in the FIG. 10B example, the first FMM FMM1 having the opening for the second inspection pixel IP2 of the inspection pattern area IPA and the first sub-pixels P1 of the display area DA may be aligned on the first substrate 111, to thereby form the first hole transporting layer 262b in the first sub-pixels P1 of the display area DA and the second inspection pixel IP2 of the inspection pattern area IPA. See operation S103 of the example of FIG. 9.

Figure 10C:
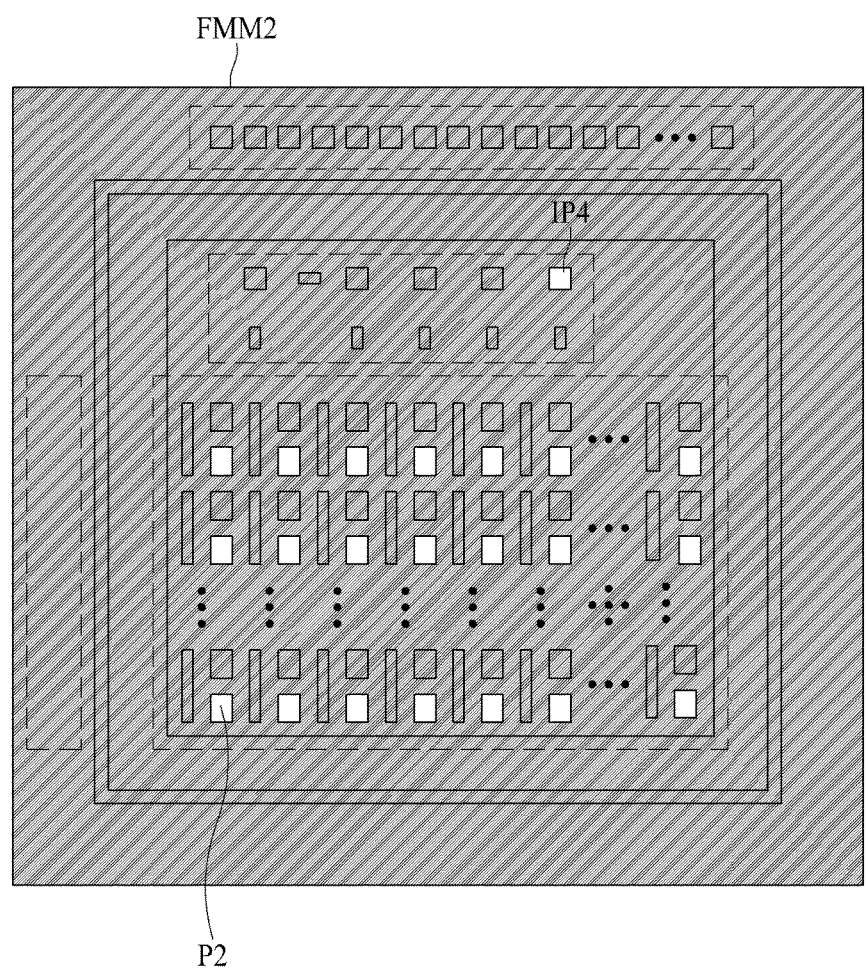

Fourthly, as shown in the FIG. 10C example, the second FMM FMM2 having the opening for the fourth inspection pixel IP4 of the inspection pattern area IPA and the second sub-pixels P2 of the display area DA may be aligned on the first substrate 111, to thereby form the second hole transporting layer 262c in the second sub-pixels P2 of the display area DA and the fourth inspection pixel IP4 of the inspection pattern area IPA. See operation S104 of the example of FIG. 9.

Figure 10D:
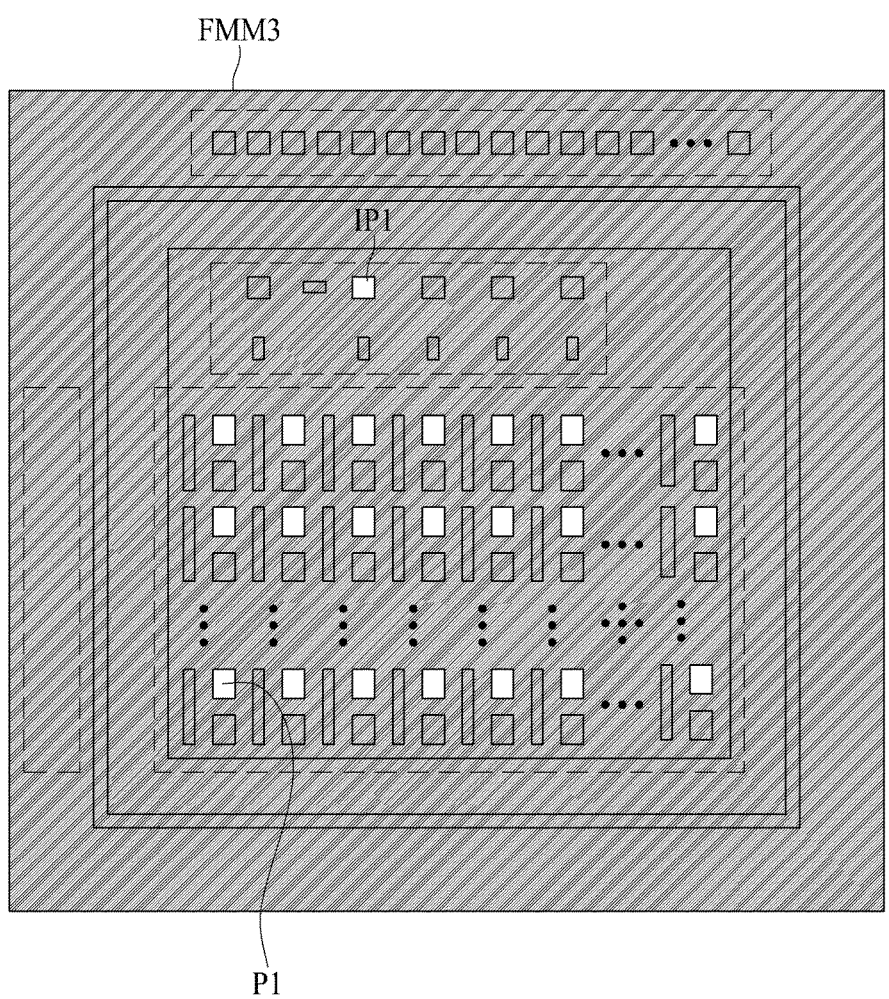

Fifthly, as shown in the FIG. 10D example, the third FMM FMM3 having the opening for the first inspection pixel IP1 of the inspection pattern area IPA and the first sub-pixels P1 of the display area DA may be aligned on the first substrate 111, to thereby form the first organic light-emitting layer 263a in the first sub-pixels P1 of the display area DA and the first inspection pixel IP1 of the inspection pattern area IPA. See operation S105 of the example of FIG. 9.

Figure 10E:
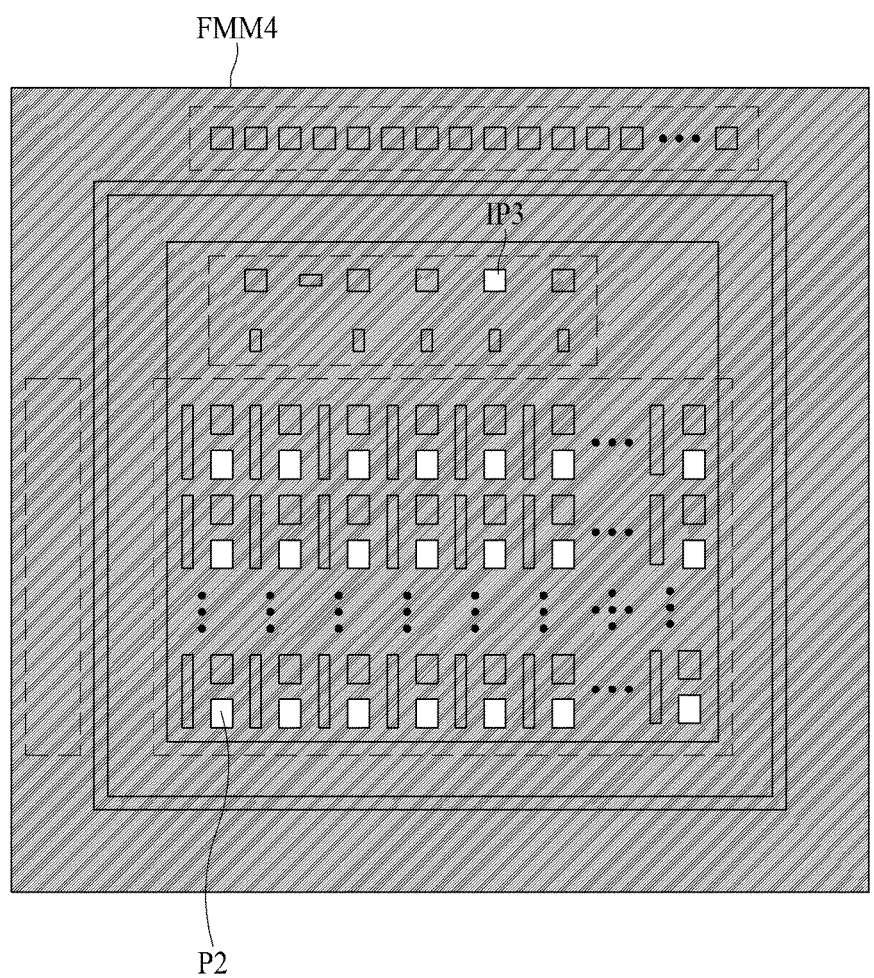

Sixthly, as shown in the FIG. 10E example, the fourth FMM FMM4 having the opening for the third inspection pixel IP3 of the inspection pattern area IPA and the second sub-pixels P2 of the display area DA may be aligned on the first substrate 111, to thereby form the second organic light-emitting layer 263b in the second sub-pixels P2 of the display area DA and the third inspection pixel IP3 of the inspection pattern area IPA. See operation S106 of the example of FIG. 9.

Figure 10F:
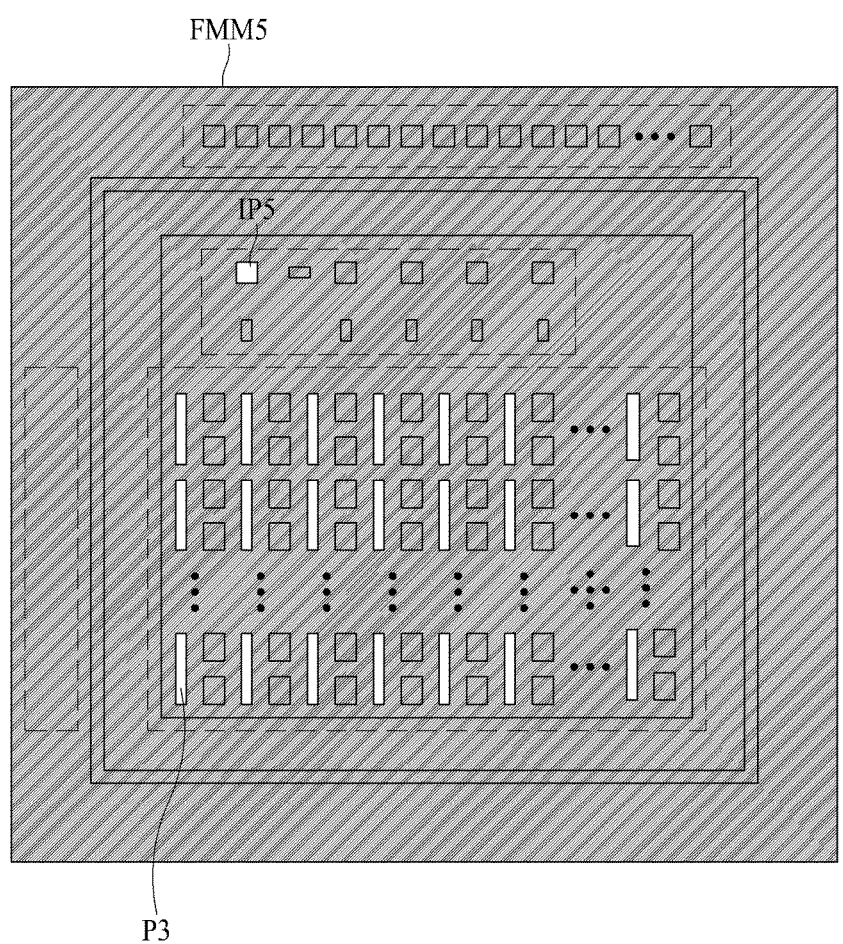

Seventhly, as shown in the FIG. 10F example, the fifth FMM FMM5 having the opening for the fifth inspection pixel IP5 of the inspection pattern area IPA and the third sub-pixels P3 of the display area DA may be aligned on the first substrate 111, to thereby form the third organic light-emitting layer 263c in the third sub-pixels P3 of the display area DA and the fifth inspection pixel IP5 of the inspection pattern area IPA. See operation S107 of the example of FIG. 9.

Eighthly, a second open mask having the opening corresponding to the display area DA may be aligned on the first substrate 111, to thereby form the electron transporting layer 264 in the first to third sub-pixels P1, P2, P3 of the display area DA. Then, the second electrode 265 may be provided on the first to third sub-pixels P1, P2, P3 of the display area DA, the first to fifth inspection pixels IP1 to IP5 of the inspection pattern area IPA, the first to sixth inspection keys IK1 to IK6 of the inspection pattern area IPA, and the alignment key AK of the inspection pattern area IPA. See operation S108 of the example of FIG. 9. Ninthly, the first to fifth inspection pixels IP1 to IP5 may be irradiated with ultraviolet (UV) rays, to thereby inspect the alignment of the first to third inspection organic light-emitting layers 363a, 363b, 363c, and the first and second hole transporting layers 362a and 362b.

Hereinafter, an alignment error calculation method for the first inspection pixel IP1 will be described in detail with reference to FIG. 11.

Figure 11:
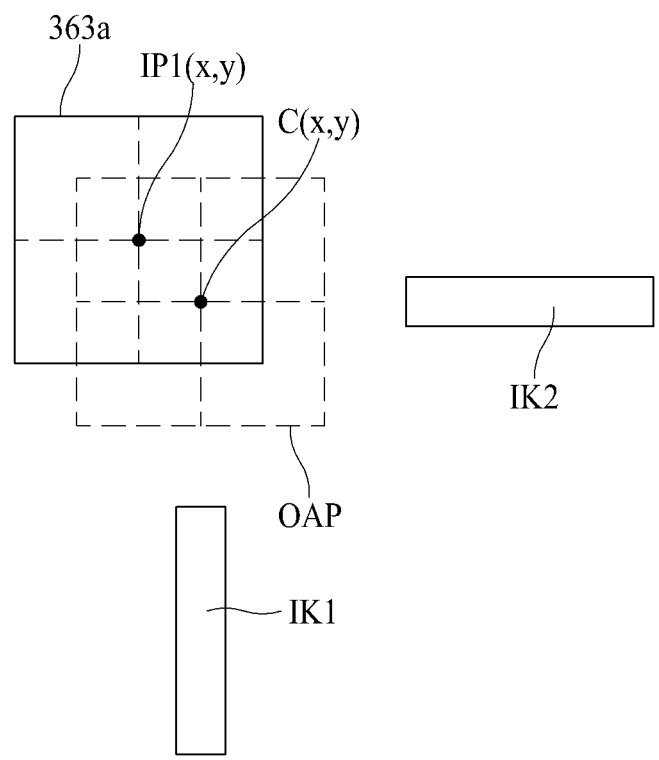
FIG. 11 illustrates an example showing an alignment error calculation method for a first inspection pixel.

FIG. 11 illustrates an example showing an alignment error calculation method for a first inspection pixel.

Firstly, an optimal alignment position OAP for the first inspection pixel IP1 may be calculated in an inspection equipment by the use of first inspection key IK1 and second inspection key IK2. Also, a deposition position of the first inspection organic light-emitting layer 363a may be checked by the inspection equipment.

Then, the center coordinates (C(x,y)) of the optimal alignment position OAP and the center coordinates (IP1(x, y)) of the first inspection organic light-emitting layer 363a may be calculated by the inspection equipment. Also, an alignment error corresponding to the difference between the center coordinates (C(x,y)) of the optimal alignment position OAP and the center coordinates (IP1(x,y)) of the first inspection organic light-emitting layer 363a may be calculated by the inspection equipment. Then, the first substrate 111 and the third FMM FMM3 may be aligned in consideration of the alignment error calculated for the deposition process of the first organic light-emitting layer 263a.

An alignment error calculation method for each of the second to fifth inspection pixels IP2 to IP5 may be the same as the above alignment error calculation method for the first inspection pixel IP1, whereby a detailed description for the alignment error calculation method for each of the second to fifth inspection pixels IP2 to IP5 will be omitted. According to the embodiment of the present disclosure, the inspection organic light-emitting layers for the alignment inspection are formed on the non-display area of the first substrate provided with the thin film transistors, whereby it may be possible to omit an inspection substrate, and furthermore, to reduce a manufacturing cost. Also, the inspection hole transporting layers for the alignment inspection may be provided on the non-display area of the first substrate, whereby it may be possible to inspect the alignment of the hole transporting layers as well as the organic light-emitting layers.

Also, the first to sixth inspection keys may be provided on the non-display area of the first substrate. For example, the first, third, fourth, fifth, and sixth inspection keys may be provided in the first direction, and the second inspection key may be provided in the second direction crossing to the first direction while being parallel to the first to fifth inspection pixels, whereby it may be possible to inspect the alignment of the inspection organic light-emitting layers of the first to fifth inspection pixels and the alignment for the first direction of the inspection hole transporting layers by the use of first, third, fourth, fifth, and sixth inspection keys, and to inspect the alignment for the second direction by the use of second inspection key.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An organic light-emitting display (OLED) device, comprising:
   a substrate;
   a display area on the substrate, the display area comprising:
      a first pixel comprising a first organic light-emitting layer configured to emit first-colored light;
      a second pixel comprising a second organic light-emitting layer configured to emit second-colored light; and
      a third pixel comprising a third organic light-emitting layer configured to emit third-colored light; and
   an inspection pattern area in a non-display area on the substrate, the inspection pattern area comprising:
      a first inspection pixel comprising a first inspection organic light-emitting layer comprising a same material as that of the first organic light-emitting layer;
      a second inspection pixel;
      a first inspection key between the first pixel and the first inspection pixel; and
      a second inspection key parallel to the first and second inspection pixels.

2. The OLED device of claim 1, wherein the second inspection pixel comprises a first inspection hole transporting layer comprising a same material as that of a first hole transporting layer in the first pixel.

3. The OLED device of claim 1, wherein:
   the first inspection key extends in a first direction; and
   the second inspection key extends in a second direction crossing the first direction.

4. The OLED device of claim 1, wherein the first pixel further comprises:
   a first electrode below the first organic light-emitting layer, the first electrode comprising a same material as those of the first and second inspection keys; and
   a second electrode on the first organic light-emitting layer.

5. The OLED device of claim 4, wherein the second electrode is on the first inspection organic light-emitting layer and the first inspection hole transporting layer.

6. The OLED device of claim 1, wherein the inspection pattern area further comprises:
   a third inspection pixel comprising a second inspection organic light-emitting layer comprising a same material as that of the second organic light-emitting layer;
   a fourth inspection pixel comprising a second inspection hole transporting layer comprising a same material as that of a second hole transporting layer in the second pixel; and a fifth inspection pixel comprising a third inspection organic light-emitting layer comprising a same material as that of the third organic light-emitting layer.

7. The OLED device of claim 6, wherein the inspection pattern area further comprises:
a third inspection key between the first pixel and the second inspection pixel;
a fourth inspection key between the second pixel and the third inspection pixel;
a fifth inspection key between the second pixel and the fourth inspection pixel; and
a sixth inspection key between the third pixel and the fifth inspection pixel.

8. The OLED device of claim 1, further comprising:
a dam configured to surround the display area in the non-display area,
wherein the inspection pattern area is between the display area and the dam.

9. The OLED device of claim 1, further comprising:
a pad area in the non-display area, the pad area comprising a plurality of pads; and
data link lines in the non-display area, the data link lines connecting the plurality of pads with data lines of the display area,
wherein the inspection pattern area overlaps the data link lines.

10. The OLED device of claim 1, further comprising:
a gate driver in the non-display area; and
gate lines connected to the gate driver,
wherein the inspection pattern area overlaps the gate lines.

* * * * *